United States Patent [19]

Peters

[11] 4,419,385
[45] Dec. 6, 1983

[54] LOW TEMPERATURE PROCESS FOR DEPOSITING AN OXIDE DIELECTRIC LAYER ON A CONDUCTIVE SURFACE AND MULTILAYER STRUCTURES FORMED THEREBY

[75] Inventor: John W. Peters, Malibu, Calif.

[73] Assignee: Hughes Aircraft Company, El Segundo, Calif.

[21] Appl. No.: 305,009

[22] Filed: Sep. 24, 1981

[51] Int. Cl.³ .................... B05D 5/12; C23C 11/00; B32B 9/04
[52] U.S. Cl. ........................... 427/99; 427/79; 427/93; 427/95; 427/255.3
[58] Field of Search ............. 427/79, 93, 95, 96, 427/99, 255.3

[56] References Cited

U.S. PATENT DOCUMENTS

| | | | |
|---|---|---|---|
| 4,239,811 | 12/1980 | Kenlage | 427/255.3 |
| 4,239,835 | 12/1980 | Iijima et al. | 427/132 |
| 4,359,490 | 11/1982 | Lehrer | 427/95 |
| 4,363,868 | 12/1982 | Takasaki et al. | 427/95 |

OTHER PUBLICATIONS

Rhodes, Semiconductor International Mar. 1981, pp. 65, 66, 68 & 70.

Sarkozy, Digest of Symposium Papers, 1981 Symposium on VLSI Technology, 1981.

Primary Examiner—William R. Dixon, Jr.
Attorney, Agent, or Firm—M. E. Lachman; W. J. Bethurum; A. W. Karambelas

[57] ABSTRACT

The specification discloses a low temperature process for forming an effective insulating layer of a selected oxide on the surface of a chosen conductive substrate. The oxide so formed has low pinhole density, good surface morphology, and good step coverage. In addition, the disclosed process simultaneously minimizes the deformation or restructuring of the surface of a temperature-sensitive conductive substrate, which would produce unwanted hillocks or spikes that degrade the insulating properties of the oxide. In accordance with the disclosed process, the substrate is exposed to a chosen vapor phase reactant in the presence of neutral, charge-free atomic oxygen to produce a reaction between the atomic oxygen and the vapor phase reactant to form the selected oxide, which deposits on the surface of the conductive substrate. Improved multilayer structures comprising multiple layers of conductive material separated by an oxide dielectric layer are formed by the disclosed process.

9 Claims, 5 Drawing Figures

LOW TEMPERATURE PROCESS FOR DEPOSITING AN OXIDE DIELECTRIC LAYER ON A CONDUCTIVE SURFACE AND MULTILAYER STRUCTURES FORMED THEREBY

BACKGROUND OF THE INVENTION

1. Field of the Invention

This invention relates generally to the manufacture of semiconductor devices, and, more particularly, to a low temperature process for depositing an oxide dielectric layer on a conductive surface, and to multilayer structures formed by such a process.

2. Description of the Prior Art

In the fabrication of semiconductor devices and circuits it is often necessary to form a layer of an oxide dielectric on the surface of a metal or other conductive material, to provide electrical insulation which prevents contact or unwanted current flow between adjacent conductive materials. With the increased microminiaturization of semiconductor devices and circuits, such as in large scale integrated circuits, and the need for higher speed operation, adjacent functional elements within a circuit on a single plane are located closer together, and interconnections are stacked one on top of the other to form multilayer structures. An increased packing density of devices and circuits can be achieved in these multilayer structures since the substrate surface area consumed by interconnections is greatly reduced. However, this increased packing density produces a stringent demand for a high quality oxide dielectric between conductive layers.

One oxide dielectric material which is frequently used in semiconductor devices and circuits is silicon dioxide ($SiO_2$), which has been formed in a variety of ways. The thermal oxidation of silicon is one of the oldest techniques for forming $SiO_2$ on a silicon wafer and is accomplished by heating a silicon wafer to 900° C. or higher in an oxygen-containing or water-containing environment, as discussed, for example by A. Amick, G. L. Schnable and J. L. Vossen in the publication entitled, "Deposition Techniques for Dielectric Films on Semiconductor Devices," in the *Journal of Vacuum Science and Technology,* Vol. 14, No. 5, Sept./Oct. 1977, pages 1053 to 1063. An oxide formed by this process is referred to herein as a "thermal oxide".

More recently, $SiO_2$ layers have been deposited by thermally activated low pressure chemical vapor deposition (LPCVD) as described, for example, by Amick et al referenced above. In such a LPCVD process, the substrate is exposed to vapor phase reactants, such as silane and oxygen, which are heated to 450° C. under reduced pressure to bring about a chemical reaction to form $SiO_2$, which deposits on the substrate. An oxide formed by such a process is referred to herein as a "LPCVD oxide". Alternatively, a layer of $SiO_2$ has been formed by a plasma-enhanced chemical vapor deposition process, as also described by Amick et al referenced above, in which the vapor phase reactants such as silane and oxygen, are subjected to a radio frequency discharge to create an ionized plasma of the reactant gases, which then interact to form the desired oxide, such as $SiO_2$, as a reaction product.

Another method by which an oxide layer may be formed is a sputtering technique, which may be either reactive or non-reactive, as described by Amick et al referenced above. Using non-reactive sputtering, a disk of a selected oxide material, such as $SiO_2$, is bombarded with inert ions to cause the oxide to vaporize and subsequently deposit on the substrate. Using reactive sputtering, a disk of silicon is bombarded with oxygen ions, which produces ionization of the silicon, and the vaporized silicon and oxygen ions then react to produce $SiO_2$.

However, some difficulty has been encountered in each of the above-described processes in reproducibly forming a high quality oxide with low pinhole density, good step coverage, and good voltage breakdown characteristics, with acceptable process yield. In addition, in the particular case of the above-described low pressure chemical vapor deposition process for $SiO_2$, the elevated temperature required for the deposition process (e.g. 45° C.) causes the surface of certain conductive substrates, such as aluminum, to deform. Hillocks and spikes are produced on the conductive surface and protrude through the oxide dielectric deposited thereon, thus generating defects or pinholes which degrade the insulating properties of the oxide.

It is the alleviation of these prior art problems of forming a high quality oxide on a conductive surface and of the deformation of a conductive surface during the deposition of an oxide layer thereon to which the present invention is directed.

SUMMARY OF THE INVENTION

I have previously discovered a low-temperature process for depositing an oxide layer on a given substrate which comprises exposing the substrate to a chosen vapor phase reactant in the presence of neutral, charge-free atomic oxygen to produce a reaction between the atomic oxygen and the vapor phase reactant, to form the oxide, which deposits as a layer on the substrate, as described in U.S. Pat. No. 4,371,587, assigned to the present assignee. In a preferred embodiment of the latter invention, the atomic oxygen is generated at a low temperature by a photochemical process, using either direct or mercury-sensitized dissociation of an unreactive oxygen-containing precursor, such as nitrous oxide, nitrogen dioxide, or molecular oxygen under selected pressure and flow rate conditions. By using neutral, charge-free atomic oxygen in the above-described process, damage to the substrate due to ionized particles and broadband electromagnetic radiation is avoided. In addition, the use of a low temperature in the above-described process is advantageous to minimize thermal damage to the substrate, such as certain types of compound semiconductor substrates which decompose at elevated temperatures.

As a further development, I have discovered that the process of my invention described in U.S. Pat. No. 4,371,587 is particularly well suited to forming a high quality oxide on the surface of a conductive substrate to provide an effective insulating layer. My process is especially useful for forming such an insulating layer on the surface of a temperature-sensitive conductive material which deforms at elevated temperature, since the process of my invention can be performed at a relatively low temperature (e.g. 30° C. to 200° C.).

The purpose of the present invention is to provide a low temperature process for forming an effective insulating layer of a selected oxide on the surface of a substrate of a chosen conductive material, and to thereby provide improved multilayer structures.

I have discovered that the above-described purpose may be accomplished by forming the selected oxide layer on the surface of a chosen conductive substrate by a low temperature process in which the substrate is exposed to a chosen vapor phase reactant in the presence of neutral, charge-free atomic oxygen to produce a reaction between the atomic oxygen and the vapor phase reactant to form the oxide, which deposits on the substrate surface. The oxide so formed has relatively low pinhole density, relatively good surface morphlogy and relatively good step coverage, and thus provides an effective insulating layer. In addition, the temperature of this oxide deposition process is sufficiently low to avoid deformation of the surface of the conductive substrate, which would produce unwanted pinholes in the insulating layer. By such a process, improved multilayer structures comprising multiple layers of conductive material separated by an insulating layer can be formed.

Accordingly, it is a purpose of the present invention to provide a new and improved process for forming an oxide layer on the surface of a conductive substrate to provide an effective insulating layer.

Another purpose is to provide a process of the type described for forming an oxide layer on a temperature-sensitive conductive substrate at a low temperature without deforming the surface of the substrate and without causing unwanted hillocks and spikes to form on the surface of the substrate.

Still another purpose is to provide a process of the type described in which the oxide so formed has a low pinhole density, good conformal characteristics, and good breakdown voltage characteristics.

Yet another purpose is to provide a process of the type described which produces a high quality oxide reproducibly and with high yield.

A further purpose of the present invention is to provide an improved multilayer structure comprising multiple layers of conductive material separated by the improved dielectric oxide formed in accordance with the process of the present invention.

A feature of the present invention is that a low-temperature photochemical vapor deposition process may be used to form the above-described oxide layer.

The foregoing and other advantages and features of the present invention will become more readily apparent from the following more particular description of the preferred embodiments of the invention, as illustrated in the accompanying drawings.

DETAILED DESCRIPTION OF THE INVENTION

Figure 1:
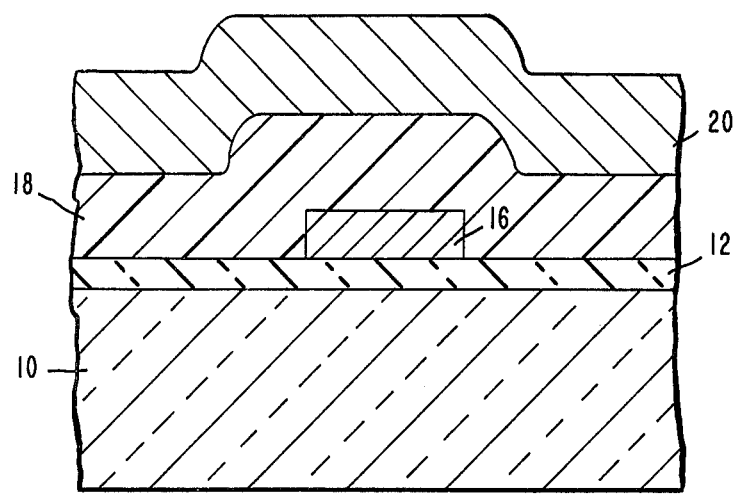
FIG. 1 illustrates, in schematic cross-section, a multilayer structure in accordance with one embodiment of the present invention.

In FIG. 1, there is shown, in schematic cross-section, a multilayer structure formed in accordance with the process of the present invention. This structure comprises a silicon substrate 10 on which is formed a layer 12 of silicon dioxide ($SiO_2$) to a thickness of approximately 3500 angstroms (Å) by a thermal process as previously discussed herein in the description of the prior art, to provided a high quality, reliable oxide on the silicon substrate. On top of the layer 12 of thermal $SiO_2$ there is formed a strip 16 of aluminum silicide alloy containing 1 percent silicon and having a thickness of approximately 4000 Å. The strip 16 is formed by known procedures including: depositing a layer of aluminum silicide on the layer 12 of thermal $SiO_2$ by known sputtering techniques, as described, for example, by Sakurai and Serikawa in the publication entitled "Liftoff Metallization of Sputtered Al Alloy FIlms," in the *Journal of the Electrochemical Society: SOLID STATE SCIENCE AND TECHNOLOGY,* Vol. 126, No. 7, July 1979, pages 1257–1260; depositing a layer of photoresist on the layer of aluminum silicide; patterning the layer of photoresist; etching the layer of aluminum silicide through the patterned photoresist layer to form the strip 16; and removing the photoresist. The latter process for patterning a metal layer by use of a photoresist is described, for example, by William S. DeForest, in the book entitled "Photoresist: Materials and Processes," McGraw-Hill Book Company, New York, 1975. The strip 16 may optionally be formed of aluminum, a refractory metal, or other highly conducting material as required for high-speed semiconductor devices.

On top of the aluminum silicide strip 16 and the adjacent surface of the thermal $SiO_2$ layer 12, there is formed a layer 18 of an oxide dielectric such as $SiO_2$, having a thickness between 1.0 and 1.5 micrometers and formed in accordance with any of the process embodiments decribed in U.S. Pat. No. 4,371,587, the details of which are incorporated herein by reference. The oxide so formed is referred to herein as a photochemical vapor deposited (photo-CVD) oxide. In accordance with a preferred embodiment of the present invention, the photo-CVD oxide layer 18 is $SiO_2$ and is formed at 200° C. by exposing the strip 16 and the adjacent surface of the layer 12 to silane and atomic oxygen which is formed by the mercury-sensitized dissociation of nitrous oxide at 2537 Å, at a low pressure, such as 1 torr. The temperature of 200° C. was chosen since it was sufficiently low so as to avoid deformation of the metal surface, but sufficiently high so as to form an oxide of good packing density and grain size. Acceptable densification of the deposited oxide layer has also been achieved at a temperature of 100° C. Thus, the heat applied in the above-described process is for the purpose of densifying the oxide product, while the photochemical vapor deposition process itself may be conducted at temperatures as low as room temperature (e.g. 30° C.). Atop the photo-CVD oxide layer 18 there is formed a layer 20 of metal, such as aluminum silicide to a thickness of approximately 1.0 micrometer by the sputtering technique previously described herein. Finally, the layer 20 of metal is alloyed for 15 minutes at 450° in nitrogen in order to minimize contact resistance.

A layer of oxide, such as the layer 18, which provides electrical insulation between two layers of conductive material which are placed one on top of the other, such as shown in FIG. 1, is referred to herein as an "interlevel insulator."

In accordance with the present invention, the deposition of the photo-CVD oxide layer 18 on the metal strip 16 takes place at a relatively low temperature, so that the surface of the metal strip does not deform or restructure to form hillocks and spikes. Consequently, the integrity of the photo-CVD oxide layer 18 is preserved and effective electrical insulation between the metal strip 16 and the overlying metal layer 20 is achieved. The photo-CVD oxide layer 18 is a high quality dielectric material which is virtually pinhole-free as discussed below in relation to FIGS. 2 and 3, and which has improved breakdown voltage characteristics as discussed below in relation to FIG. 4.

While the discussion of FIG. 1 refers to the strip 16 as being formed of aluminum silicide or a metal, these materials are intended merely as examples. The process of the present invention may be used to form a high quality oxide on the surface any conductive material, including but not limited to aluminum, aluminum silicide, magnesium, chromium, molybdenum, tungsten, titanium, vanadium, iron, copper, indium, tin, indium tin oxide, tin oxide, and conductive polymers, such as polyacetylene. The process of the present invention forms a high quality oxide which provides an effective insulating layer on a conductive substrate. In addition, the process of the present invention forms this high quality oxide at a sufficiently low temperature so as to avoid deformation of the surface of a temperature-sensitive conductive material, as discussed above.

The multilayer structure shown in FIG. 1 is used in very large scale and high speed integrated circuits, gate array structures, metal-oxide-semiconductor devices, and bipolar devices. In addition, the present invention may be used to form improved parallel plate capacitors with the oxide providing electrical insulation between the capacitor plates, as shown in FIG. 3.

Figure 2:
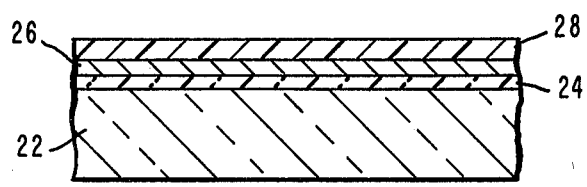
FIG. 2 illustrates, in schematic cross-section, an aluminized test wafer with an oxide dielectric layer formed atop the aluminum layer in accordance with the present invention, and which was used to determine the pinhole density of the oxide layer of the present invention.

In FIG. 2 there is shown, in schematic cross-section, an aluminized test wafer having an oxide layer on a metal substrate which was formed in accordance with present invention, and used to determine the pinhole density or defect density of the photo-CVD oxide dielectric layer. The test wafer of FIG. 2 comprises a substrate 22 of a semiconductor material such as silicon, atop which is formed a layer 24 of a thermal $SiO_2$, as described in relation to the layer 12 of FIG. 1. The layer 24 of thermal $SiO_2$ is formed to a thickness of approximately 3500 Å, for example, at which the oxide exhibits a bright interference color, such as purple or violet. Atop the layer 24 of thermal $SiO_2$, there is formed a layer 26 of aluminum or aluminum silicide to a thickness of approximately 1 micrometer by known sputtering techniques, as previously described. The layer 28 of photo-CVD $SiO_2$ is formed on top of the layer 26 of aluminum to a thickness of approximately 1 micrometer at 200° C. by the low-temperature photochemical vapor deposition process disclosed in U.S. Pat. No. 4,371,587, using silane and the mercury-sensitized dissociation of nitrous oxide at 2537 Å.

The oxide defect density of the layer 28 of the photo-CVD $SiO_2$ was determined by a known chemical etch technique in which the wafer shown in FIG. 2 was immersed in an etchant which is specific for aluminum and unreactive with $SiO_2$, such as a mixture of phosphoric, nitric, and acetic acids, for a period of 30 minutes at 40° C. If a pinhole is present in the photo-CVD $SiO_2$ layer 28, the etchant will penetrate through the pinhole to the underlying aluminum layer 26, etch the aluminum exposed by the pinhole, and thus expose a portion of the underlying thermal oxide layer 24. By examining this structure under a microscope at 200 power magnification, the exposed portions of the thermal $SiO_2$ layer 24 are evident by their bright interference color. The pinhole density is determined by a direct count of the colored spots per area. By the above-described etching process, it was determined that the defect density of the photo-CVD $SiO_2$ layer 28 was virtually zero, except in a few small areas. This is to be compared to a calculated pinhole density of 200 per square centimeter for a large area capacitor with a LPCVD oxide as discussed in relation to FIG. 3. Thus, the structure shown in FIG. 2 and formed in accordance with the present invention has a virtually pinhole-free oxide layer formed on a layer of aluminum, which enhances the electrical insulating properties of the oxide layer. In addition, the results of the pinhole testing were found to be correlated with the electrical breakdown performance discussed below in relation to FIG. 3, with structures having a low pinhole density having high electrical breakdown voltages.

Figure 3:
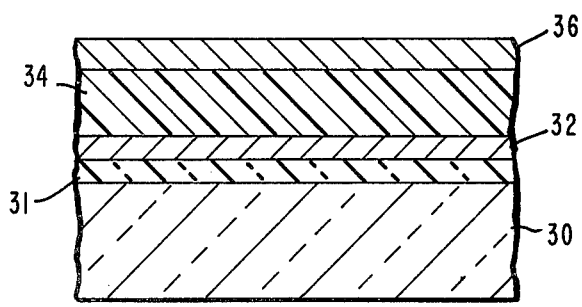
FIG. 3 illustrates, in schematic cross-section, a standard parallel plate capacitor, having an oxide layer on a metal substrate which was formed in accordance with the present invention, and used for electrically evaluating the pinhole density of the oxide layer.

Turning now to FIG. 3, there is shown, in schematic cross-section, a standard large area (600 by 600 micrometers) parallel plate capacitor formed in accordance with the present invention. The structure of FIG. 3 comprises a substrate 30 of silicon, atop which is formed a layer 31 of a thermal $SiO_2$ to a thickness of 4000 Å by a known wet oxidation process at 925° C. On top of the layer 31 of thermal $SiO_2$, there is formed a layer 32 of a first metal, such as aluminum silicide, to a thickness of 4000 Å, by known sputtering techniques previously described herein. Over the first metal layer 32 there is formed a layer 34 of a photo-CVD $SiO_2$ having a thickness of 15,000 Å and formed at 200° C. in accordance with the low temperature photo-CVD process disclosed in U.S. Pat. No. 4,371,587, using silane and the mercury-sensitized dissociation of nitrous oxide at 2537 Å. A layer 36 of a second metal, such as aluminum silicide, is formed over the layer 34 of the photo-CVD $SiO_2$, to a thickness of 10,000 Å by the technique referenced above with respect to the first metal layer 32.

Using the structure shown in FIG. 3, an electrical evaluation of the density of pinholes or electrically active defects in the photo-CVD oxide layer 34 was performed as follows. (A large area capacitor was used in order to increase the probability of finding pinholes.) One electrical contact was made to the first metal layer 32 by means of a first contact point on the periphery of the test circuit, and a second electrical contact was made to the second metal layer 36 by means of a second peripheral contact point. A voltage was applied across the two contacts, starting at zero volts and being gradually or incrementally increased to 100 volts (i.e., the industry-accepted standard of the maximum voltage a one-micrometer thick insulator should withstand without breakdown for use between metal layers in integrated circuit applications). The current was monitored as a function of the voltage input. A current output of less than 10 microamperes indicates that the oxide layer has good insulating properties and no pinholes; whereas a current output of more than 10 microamperes indicates that the oxide layer has pinholes which cause electrical short-circuiting and oxide breakdown. The voltage at which electrical breakdown of the oxide occurs is referred to as the "breakdown voltage" of the oxide. Using the structure shown in FIG. 3 and having the photo-CVD SiO$_2$ layer 34, the average breakdown voltage was determined to occur typically at 500 volts, ranging from 433 to 558 volts; and the yield of these capacitors surpassing the electrical breakdown voltage requirements (i.e. 100 volts) was typically 95 percent or higher, often close to 100 percent. The calculated pinhole density corresponding to these high electrical yields was typically 5 per square centimeter. Using a structure similar to that shown in FIG. 3 except that the oxide layer was formed by a LPCVD oxidation process as previously described herein, the average yield of these capacitors surpassing the electrical breakdown voltage requirements was typically less than 50 percent. Electrical yields less than 50 percent have been found to correspond to a calculated pinhole density of 200 per square centimeter. Thus, the structure of FIG. 3 formed in accordance with the present invention has improved insulating properties as compared to a structure with a prior art oxide, and is virtually pinhole free.

Figure 4:
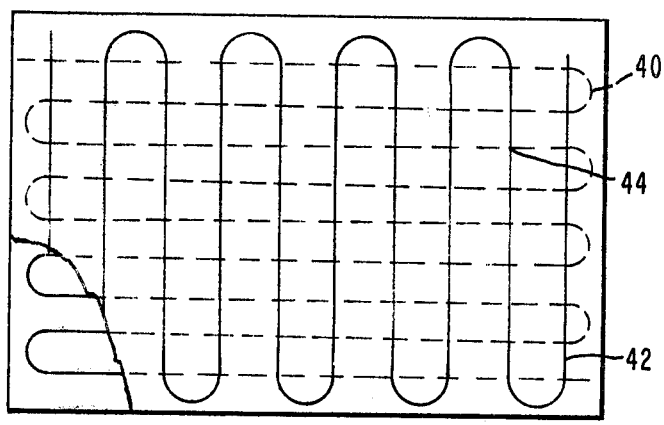
FIG. 4 illustrates, in schematic form, the top view of a serpentine capacitor having an oxide layer on a metal substrate which was formed in accordance with the present invention, and used for determining the uniformity of oxide step coverage.

The above-described test to determine oxide breakdown voltage by measuring current output versus voltage input was repeated on the structure shown in FIG. 4. The serpentine capacitor shown in top view in FIG. 4 comprises the same type of structure as shown in FIG. 3, except that each metal layer is formed in a serpentine pattern and the two serpentine metal patterns are perpendicular to each other. Thus, the serpentine capacitor comprises a silicon substrate on the surface of which is formed a layer of thermal SiO$_2$ to a thickness of 4000 Å, as described in relation to FIG. 3. On top of the layer of thermal SiO$_2$, there is deposited a layer of a first metal, in a manner such as decribed with respect to FIG. 3. Then, using known photoresist masking and etching techniques, the first metal layer is patterned to form the first serpentine metal layer 40 shown in FIG. 4. Next, there is formed atop the serpentine metal layer 40 a layer of photo-CVD SiO$_2$ (not shown) to a thickness of 15,000 Å in accordance with the present invention, as previously described herein. On top of the layer of photo-CVD SiO$_2$, there is formed a second layer of metal, such as aluminum silicide, to a thickness of 10,000 Å by the process previously described with respect to FIG. 3. Finally, using known photoresist masking and etching techniques, the second layer of metal is patterned to form the second serpentine metal layer 42 shown in FIG. 4, which is normal to the first serpentine metal layer 40.

The purpose of performing the breakdown voltage test on the serpentine structure shown in FIG. 4 is to determine the uniformity of the oxide thickness and, in particular, whether there is good step coverage where the layers 40 and 42 intersect, for example at the crossover point 44 shown in FIG. 4. If oxide thinning occurs at the base of the step, then breakdown will occur at a lower voltage than without thinning. Using the structure shown in FIG. 4 with a photo-CVD SiO$_2$ insulating layer, the breakdown voltage was determined to occur typically at 400 volts, ranging from 318 to 504 volts; and the yield of these capacitors surpassing the electrical breakdown voltage requirements (i.e. 100 volts) was typically 95 percent or higher. Using a structure of the type shown in FIG. 4 except having the interlevel SiO$_2$ layer formed by a LPCVD process as previously decribed herein, the average yield of these capacitors surpassing the electrical breakdown voltage requirements was approximately 50 percent. Thus, the structure shown in FIG. 4 and formed in accordance with the present invention has been demonstrated to have good step coverage and the resultant desirable breakdown voltage characteristics.

Figure 5:
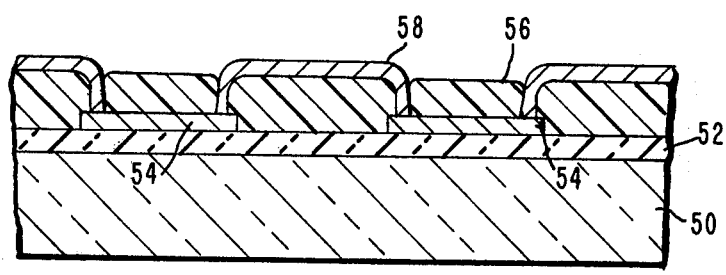
FIG. 5 illustrates, in schematic cross-section, a via chain structure having an oxide layer on a metal substrate which was formed in accordance with the present invention, and used for testing the electrical continuity of the via chains.

Turning now to FIG. 5, there is shown, in schematic cross-section, a via chain structure formed in accordance with the present invention and used to evaluate via electrical continuity, which depends, in part, on the quality of the interlevel insulator (i.e. the insulator between two metal layers). The structure of FIG. 5 comprises a silicon substrate 50 on the surface of which has been formed a layer 52 of SiO$_2$ by a prior art thermal process previously described herein. Atop the layer 52 of thermal SiO$_2$ there is formed a patterned layer comprising the separated rectangular strips 54 of a first metal, such as aluminum silicide, having a thickness of approximately 5000 Å, with the separation between adjacent metal strips being approximately equal to the length of a metal strip (e.g. 50 micrometers). The patterned layer comprising the metal strips 54 is formed by known photolithographic masking and etching techniques as previously described in relation to forming metal strip 16 in FIG. 1. Atop the patterned layer comprising the metal strips 54 of the first metal there is formed a layer of a photo-CVD silicon dioxide to a thickness of 1 micrometer, by the low temperature photochemical vapor deposition process disclosed in U.S. Pat. No. 4,371,587, at 200° C. using silane and the mercury-sensitized dissociation of nitrous oxide at 2537 Å. The layer of photo-CVD silicon dioxide is then etched through a photoresist mask with buffered hydrofluoric acid to form vias or openings in the photo-CVD SiO$_2$, to expose portions of each metal strip 54 of the first metal for subsequent contact with a second metal as decribed below. A via opening is etched to a typical base area of 5 by 5 micrometers and one via is formed at each extremity of a single metal strip 54 of the first metal. Etching of the layer of photo-CVD SiO$_2$ to form the vias results in formation of the patterned layer 56 of photo-CVD SiO$_2$ shown in FIG. 5. Finally, a patterned layer comprising the strips 58 of a second metal, such as aluminum silicide, is formed in the same manner as the patterned layer comprising the strips 54 of the first metal described above. This patterned layer comprising the strips 58 is formed over the patterned layer 56 of photo-CVD SiO$_2$ and into the adjacent vias as shown in FIG. 5, thereby contacting the exposed portion of each metal strip 54 of the first metal at the base of the via.

Thus, in the structure shown in FIG. 5, the second layer of metallization connects only with the first layer of metallization and such connection occurs only through the via openings in the photo-CVD SiO$_2$ layer. The via chain shown in FIG. 5 comprises a continuous chain of alternating areas of contact between the two metal layers and electrical isolation between the two metal layers. The via chain typically consists of a square or rectangular array of 100 vias, arranged in a 10 by 10 configuration.

The via chain structure shown in FIG. 5 was used to evaluate via electrical continuity, which is determined by, among other things, the quality of the contact between the two metal layers at the base of the via, by the quality of step coverage of the second metal layer over the photo-CVD oxide, and by the quality of the step coverage and the surface morphology of the photo-CVD oxide over the first metal layer.

Using the structure shown in FIG. 5, the electrical continuity of the via chain was measured. Electrical contact was made with each terminal at the extremities of the via chain, a voltage was applied, and the resistance was determined. The average resistance per via opening was determined to be less than one ohm, which is within present industry-accepted limits. Thus, it was determined that there was good electrical continuity between the two metal layers shown in FIG. 5, throughout the via chain and that the process of the present invention for forming the oxide layer 56 is compatible with maintaining continuity within acceptable limits. These results also indicated good step coverage of the second metal layer comprising strips 58 over the patterned photo-CVD $SiO_2$ layer 56. The significance of the structure shown in FIG. 5 is that such a structure permits two layers of metallization, rather than one, to be used over the same substrate surface, and thus permits a desirably increased number of gates per square millimeter ($mm^2$) on a wafer. The gate density of a wafer with double layer metallization may be as high as 150 gates/$mm^2$ as compared to 20 gates/$mm^2$ for single layer metallization.

In actual practice, the test structures shown in FIGS. 3, 4, and 5 can be combined on a single test chip comprising, for example: one large area capacitor having dimensions of 600 by 600 micrometers; two serpentine capacitors having 300 crossovers and 600 edges; and three via chains each arranged in an array of 10 by 10 vias, with base areas of 5 by 5 micrometers, 4 by 4 micrometers, and 3 by 3 micrometers.

In addition, scanning electron microscope (SEM) photographs of layers of photo-CVD $SiO_2$ deposited over both aluminum and silicon substrates comprising dimensions representative of high density integrated circuits indicate excellent conformal coating of the $SiO_2$ over edges, with no cracking and a smooth top surface, and with uniform thickness. Good conformal characteristics and, in particular, good step coverage are important for obtaining good insulating properties from a dielectric oxide. The exceptional step coverage obtained with the photo-CVD $SiO_2$ satisfies one of the primary requirements for a viable interlevel insulator for double level metallization. In addition, the requirements of low pinhole density and uniform surface morphology for the interlevel insulator are satisfied by the photo-CVD $SiO_2$.

Thus, by using the process of the present invention, a multilayer structure comprising an oxide dielectric deposited on a conductive layer can be formed at a relatively low temperature which prevents the formation of unwanted hillocks and spikes on the conductive surface. The oxide so formed is an effective insulating layer, is of good quality, being virtually pinhole free, having improved breakdown voltage characteristics, and having good conformal characteristics. In addition, the process for forming the oxide as described herein has high reproducibility and high yield.

While the present invention has been particularly described with respect to the preferred embodiments thereof, it will be recognized by those skilled in the art that certain modifications in form and detail may be made without departing from the spirit and scope of this invention. In particular, the present invention is not limited to the formation of a layer of silicon dioxide on aluminum or aluminum silicide, which was used merely as an example, but includes the low temperature deposition of any oxide (including a doped oxide), which can be formed by any of the process embodiments disclosed in U.S. Pat. No. 4,371,587. The present invention further includes the deposition of such an oxide on any metal or conductive substrate, and is particularly advantageous for substrates which undergo surface deformation or restructuring when exposed to elevated temperatures. In addition, the process described herein may be performed at temperatures below 200° C. and, in some cases, as low as room temperature. Further, while the silicon dioxide formed in accordance with the present invention has been referred to as a "photo-CVD" oxide, it is not intended to limit the present invention to the process embodiment of U.S. Pat. No. 4,371,587 in which the atomic oxygen is photochemically generated; rather, it is intended to include any oxide formed by any process embodiment of U.S. Pat. No. 4,371,587. Finally, it is not intended to limit the present invention to the particular multilevel structures disclosed herein, but to include any structure in which a metal or conductive layer or pattern has an oxide dielectric formed thereon by the low temperature process disclosed in U.S Pat. No. 4,371,587.

What is claimed is:

1. A process for forming an effective insulating layer of an oxide of a chosen element on the surface of a substrate of a chosen conductive material comprising the step of exposing said surface to a chosen vapor phase reactant containing said chosen element in the presence of neutral atomic oxygen at a temperature sufficiently low to minimize deformation of said surface of said substrate to thereby produce a reaction between said atomic oxygen and said reactant to form said oxide which deposits as a layer on said surface of said substrate, whereby said layer of said oxide exhibits relatively low pinhole density, relatively good surface morphology, and relatively good step coverage to thereby provide said effective insulating layer.

2. The process as set forth in claim 1 wherein said atomic oxygen is photochemically generated by the mercury photosensitized dissociation of a chosen chemically unreactive oxygen-containing precursor.

3. The process as set forth in claim 1 wherein said atomic oxygen is photochemically generated by the exposure of a chosen chemically unreactive oxygen-containing precursor to radiation of a selected wavelength to cause the direct dissociation of said precursor to form said atomic oxygen.

4. The process as set forth in claim 2 or 3 wherein said chosen chemically unreactive oxygen-containing precursor is selected from the group consisting of: nitrous oxide, nitrogen dioxide, and molecular oxygen under selected pressure and flow rate conditions.

5. The process as set forth in claim 1 wherein said chosen conductive material is selected from the group consisting of aluminum, aluminum silicide, magnesium chromium, molybdenum, tungsten, titanium, vanadium, iron, copper, indium, tin, indium tin oxide, tin oxide, and polyacetylene.

6. The process as set forth in claim 1 wherein said substrate of said chosen conductive material is selected from the group consisting of a continuous layer of said chosen conductive material formed on a second substrate, and a patterned layer of said chosen conductive material formed on a second substrate.

7. A process for forming a low defect density layer of an oxide of a chosen element on the surface of a chosen temperature-sensitive conductive substrate while simultaneously minimizing deformation of said surface, comprising the step of exposing said surface to a chosen vapor phase reactant containing said chosen element in the presence of neutral, charge-free oxygen atoms to thereby produce a reaction between said neutral oxygen atoms and said reactant to form said oxide which deposits on said surface of said substrate, whereby the temperature of said reaction is sufficiently low to minimize said deformation of said surface of said chosen temperature-sensitive conductive substrate.

8. A process for forming an effective insulating layer of silicon dioxide on the surface of a chosen temperature sensitive conductive substrate comprising the step of exposing said surface to a chosen silicon-containing vapor phase reactant in the presence of neutral, charge-free oxygen atoms to thereby react said oxygen atoms and said reactant to form said silicon dioxide on said surface, whereby the temperature of said process is sufficiently low to prevent the formation of unwanted hillocks or spikes on said surface which would penetrate said insulating layer to form unwanted pinholes therein.

9. The process as set forth in claim 8 wherein said chosen silicon-containing vapor phase reactant is silane ($SiH_4$) and said exposing takes place at a temperature within the range of 100° C. to 200° C.

* * * * *